(12) United States Patent
Erk et al.

(10) Patent No.: US 8,309,464 B2
(45) Date of Patent: Nov. 13, 2012

(54) METHODS FOR ETCHING THE EDGE OF A SILICON WAFER

(75) Inventors: Henry F. Erk, St. Louis, MO (US); Peter D. Albrecht, O'Fallon, MO (US); Eugene R. Hollander, Foristell, MO (US); Thomas E. Doane, Troy, MO (US); Judith A. Schmidt, Troy, MO (US); Roland R. Vandamme, Wentzville, MO (US); Guoqiang (David) Zhang, Ballwin, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 658 days.

(21) Appl. No.: 12/415,551

(22) Filed: Mar. 31, 2009

(65) Prior Publication Data

US 2009/0247055 A1    Oct. 1, 2009

Related U.S. Application Data

(60) Provisional application No. 61/040,857, filed on Mar. 31, 2008.

(51) Int. Cl.
*H01L 21/302* (2006.01)
*H01L 21/461* (2006.01)

(52) U.S. Cl. .......... 438/689; 438/691; 438/692; 438/693

(58) Field of Classification Search .................. None
See application file for complete search history.

(56) References Cited

U.S. PATENT DOCUMENTS

| | | | |
|---|---|---|---|
| 3,964,957 | A | 6/1976 | Walsh |
| 4,251,317 | A | 2/1981 | Foote |
| 4,388,140 | A | 6/1983 | Nakazato et al. |
| 4,588,473 | A | 5/1986 | Hisatomi et al. |
| 4,849,701 | A | 7/1989 | Saatkamp et al. |
| 4,971,645 | A | 11/1990 | Licus |
| 5,211,794 | A | 5/1993 | Enomoto et al. |
| 5,233,218 | A | 8/1993 | Miura |
| 5,236,548 | A | 8/1993 | Stadler et al. |
| 5,246,528 | A | 9/1993 | Hasegawa et al. |
| 5,340,437 | A | 8/1994 | Erk et al. |
| 5,425,846 | A | 6/1995 | Koze et al. |
| 5,429,711 | A | 7/1995 | Watanabe et al. |
| 5,668,045 | A | 9/1997 | Golland et al. |
| 5,783,097 | A | 7/1998 | Lo et al. |
| 5,825,385 | A | 10/1998 | Silverbrook |
| 5,834,812 | A | 11/1998 | Golland et al. |
| 5,843,322 | A | 12/1998 | Chandler, Jr. |

(Continued)

FOREIGN PATENT DOCUMENTS

EP    529888 A1    3/1993

(Continued)

OTHER PUBLICATIONS

Office Action dated May 27, 2011 in Co-Owned U.S. Appl. No. 12/415,274.

(Continued)

*Primary Examiner* — Duy Deo
(74) *Attorney, Agent, or Firm* — Armstrong Teasdale LLP

(57) ABSTRACT

The present disclosure generally relates to the manufacture of silicon wafers, and more particularly to edge etching apparatus and methods for etching the edge of a silicon wafer.

45 Claims, 19 Drawing Sheets

U.S. PATENT DOCUMENTS

| | | | |
|---|---|---|---|
| 5,879,577 A | 3/1999 | Weng et al. | |
| 5,933,902 A | 8/1999 | Frey | |
| 5,945,351 A | 8/1999 | Mathuni | |
| 6,046,117 A | 4/2000 | Bauer et al. | |
| 6,110,839 A | 8/2000 | Nakano et al. | |
| 6,117,778 A | 9/2000 | Jones et al. | |
| 6,152,507 A | 11/2000 | Pirker | |
| 6,162,739 A | 12/2000 | Sumnitsch et al. | |
| 6,294,469 B1 | 9/2001 | Kulkarni et al. | |
| 6,309,981 B1 | 10/2001 | Mayer et al. | |
| 6,328,846 B1 | 12/2001 | Langen et al. | |
| 6,333,275 B1 | 12/2001 | Mayer et al. | |
| 6,368,192 B1 | 4/2002 | Jones et al. | |
| 6,383,060 B2 | 5/2002 | Kawasaki et al. | |
| 6,395,646 B1 | 5/2002 | Liu | |
| 6,482,749 B1 * | 11/2002 | Billington et al. | 438/745 |
| 6,494,221 B1 | 12/2002 | Sellmer et al. | |
| 6,497,784 B1 | 12/2002 | Jones et al. | |
| 6,503,363 B2 | 1/2003 | Nakano et al. | |
| 6,523,553 B1 * | 2/2003 | Redeker et al. | 134/61 |
| 6,586,342 B1 | 7/2003 | Mayer et al. | |
| 6,833,063 B2 | 12/2004 | Basol | |
| 6,881,675 B2 | 4/2005 | Pan et al. | |
| 6,939,807 B2 | 9/2005 | Yun et al. | |
| 7,007,702 B2 | 3/2006 | Langen | |
| 7,029,567 B2 | 4/2006 | Basol | |
| 7,223,323 B2 * | 5/2007 | Yang et al. | 204/242 |
| 7,323,421 B2 | 1/2008 | Stinson et al. | |
| 7,867,059 B2 * | 1/2011 | Pietsch et al. | 451/11 |
| 2001/0015170 A1 | 8/2001 | Kitabatake | |
| 2003/0038383 A1 | 2/2003 | Sakaguchi | |
| 2003/0116444 A1 | 6/2003 | Basol | |
| 2003/0141201 A1 | 7/2003 | Basol | |
| 2003/0216046 A1 | 11/2003 | Pan et al. | |
| 2004/0077159 A1 | 4/2004 | Yun et al. | |
| 2004/0084315 A1 | 5/2004 | Mizohata et al. | |
| 2004/0251518 A1 | 12/2004 | Preusse et al. | |
| 2005/0150867 A1 | 7/2005 | Sax | |
| 2005/0150877 A1 | 7/2005 | Araki | |
| 2006/0026683 A1 | 2/2006 | Lim | |
| 2006/0115986 A1 | 6/2006 | Donohoe et al. | |
| 2006/0137994 A1 | 6/2006 | Basol et al. | |
| 2006/0172538 A1 | 8/2006 | Itzkowitz et al. | |
| 2006/0205217 A1 | 9/2006 | Pan et al. | |
| 2006/0252272 A1 | 11/2006 | Koyata et al. | |
| 2006/0266383 A1 * | 11/2006 | Tran et al. | 134/34 |
| 2007/0161247 A1 | 7/2007 | Koyata et al. | |
| 2009/0242126 A1 | 10/2009 | Erk et al. | |

FOREIGN PATENT DOCUMENTS

| | | |
|---|---|---|
| EP | 0544131 A1 | 6/1993 |
| EP | 744082 A1 | 11/1996 |
| EP | 0544131 B1 | 3/1997 |
| EP | 774776 A2 | 5/1997 |
| EP | 924148 A1 | 6/1999 |
| EP | 1058300 A2 | 6/2000 |
| EP | 924148 B1 | 1/2001 |
| EP | 774776 B1 | 4/2003 |
| EP | 1456868 A2 | 9/2004 |
| EP | 1662560 A2 | 5/2006 |
| EP | 1855309 A1 | 11/2007 |
| JP | 57141926 A2 | 2/1982 |
| JP | 2015628 A | 1/1990 |
| JP | 5013388 A | 1/1993 |
| JP | 6244167 A | 9/1994 |
| JP | 10056006 A | 2/1998 |
| JP | 2000082690 A | 3/2000 |
| JP | 2001044147 A | 2/2001 |
| JP | 2001044170 A | 2/2001 |
| JP | 2002043294 A | 2/2002 |
| JP | 2002110626 A | 4/2002 |
| JP | 2002170808 A | 6/2002 |
| JP | 2002334879 A | 11/2002 |
| JP | 2003045845 A | 2/2003 |
| JP | 2004111439 A | 4/2004 |
| JP | 2004149895 A | 5/2004 |
| JP | 2004296810 A | 10/2004 |
| JP | 2005005701 A | 1/2005 |
| WO | 96/17377 A1 | 6/1996 |
| WO | 97/27621 A1 | 7/1997 |
| WO | 03/060963 A2 | 7/2003 |
| WO | 2006/060752 A2 | 6/2006 |
| WO | 2006092886 A1 | 9/2006 |
| WO | 2010098007 A1 | 9/2010 |

OTHER PUBLICATIONS

International Search Report and Written Opinion for related Application No. PCT/US2009/038975 dated Jun. 30, 2009.

PCT International Search Report and Written Opinion of the International Searching Authority mailed on Jan. 1, 2010 regarding PCT/US2009/064545 filed on Nov. 16, 2009, 15 pages.

Co-Owned U.S. Appl. No. 13/130,160, filed May 25, 2011.

Semi 1978, Standards M1-1105E—Specifications for Polished Monocrystalline Wafers, pp. 17, 22 and 23 (2006).

Non-Final Office Action dated Aug. 17, 2011 cited in related U.S. Appl. No. 12/415,555, filed Mar. 31, 2011; 8 pages.

* cited by examiner

METHODS FOR ETCHING THE EDGE OF A SILICON WAFER

CROSS-REFERENCE TO RELATED APPLICATION

This application claims the benefit of U.S. Provisional Application No. 61/040,857, filed Mar. 31, 2008.

FIELD OF THE DISCLOSURE

The present disclosure generally relates to the manufacture of silicon wafers, and more particularly to apparatus and methods for etching the edge of a silicon wafer.

BACKGROUND OF THE DISCLOSURE

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. The individual wafers are subjected to a number of processing operations to reduce the thickness of the wafer, remove damage caused by the slicing and/or other processing operations, and to create at least one highly reflective surface (e.g., on a front surface of the wafer).

In addition to having at least one highly reflective surface, semiconductor wafers for advanced applications preferably have edges that are smooth, damage-free, and polished. Damaged edges may cause edge slip during thermal processing of the wafer. In addition, rough or pitted edges may trap particles that can be later released in a wet cleaning bath. The released particles may then undesirably migrate to the surface of the wafer. Furthermore, various films are deposited onto the wafer surface in some applications, which may deposit at the edge of the wafer. If the edge is not sufficiently smooth, residual film deposits at the edge may flake off. The flakes may come into contact with the surface of the wafer thereby causing surface defects. Conventional silicon wafer processing typically includes an edge treatment operation (e.g., polishing or etching) to provide edges that are sufficiently smooth.

Prior to edge treatment, silicon wafers are typically subjected to a lapping or grinding operation to provide a wafer of the desired flatness, followed by an etching operation (acidic or caustic) to produce a wafer having desired surface roughness. After the flattening and etching operations, the wafers are typically subjected to a double-sided polishing operation to provide smooth front and back wafer surfaces.

In edge polishing operations, wafer edges, including any orientation notch or flat, are typically polished by applying silica to a polishing pad or other surface that is pressed against the wafer edge. Generally, these polishing operations are carried out at a separate station and involve removing dry wafers from a process cassette, aligning the notches in the wafers, polishing the notch in the wafers, polishing the edge of the wafers, scrubbing and/or cleaning the wafers, spin drying the wafers, and then returning the dry wafers to the process cassette where the wafer can be moved to the next station. While edge polishing has proven effective, this operation increases processing time and cost.

Edge etching operations typically include directing an etchant to the edge of the silicon wafer, typically to that portion of the surface extending from the peripheral edge to the flat portion of the wafer surface. Prevention of significant contact of the etchant with the flat portion of the wafer surface is addressed by various methods. These methods include supporting the wafer on a chuck and directing the etchant to the edge of the wafer surface. However, in these types of methods, it may be difficult to etch the peripheral edge of the wafer within the contour of a wafer notch. Various other methods involve stacking wafers together, often including gaskets between adjacent wafers, and directing the etchant to the exposed edge portion of the wafer. One disadvantage of these types of edge etching operations is difficulty in separating the wafers after etching.

Recent advances in grinding technology provide flatter wafers with improved nanotopology, and the grinding surface depth has become more uniform and shallow. In addition, recent double-sided polishing operations offer the advantage of removal of small amounts of subsurface damage on both sides of the wafer. In fact, increased stock removal by double-sided polishing may increase the burden on the edge treatment (e.g., polishing) operation.

Thus, there remains an unfulfilled need for a wafer edge treatment method that addresses the disadvantages of current edge treatment operations and is suitable for use in wafer processing operations utilizing recent developments in various aspects of wafer processing (e.g., grinding and/or double-sided polishing).

SUMMARY OF THE DISCLOSURE

Briefly, therefore, the present disclosure generally relates to a method for treating (e.g., etching) the edge of a silicon wafer.

In particular, the present disclosure is directed to methods for removing silicon from a surface of a silicon wafer. The wafer comprises a central axis, a front surface and a back surface that are generally perpendicular to the central axis, a radius, R, extending from the central axis to a point along the peripheral edge of the wafer, a point along the peripheral edge of the wafer nearest the central axis, and edge portions of the front and back surfaces of the wafer. The edge portions extend from the nearest peripheral edge point to a point between the nearest peripheral edge point and the central axis and no more than about 15 mm from the nearest peripheral edge point. The method includes contacting with an etchant (i) the peripheral edge of the wafer, (ii) the edge portion of the front surface of the wafer, and (iii) the edge portion of the back surface of the wafer.

In various embodiments, the contacting of the wafer with the etchant occurs prior to reducing the flatness of the wafer by more than about 50%.

In other embodiments, the wafer has a total thickness variation of at least about 20 microns prior to contacting the wafer with the etchant.

In various other embodiments, the method further comprises reducing the total thickness variation of the edge-etched wafer to less than about 3 microns.

In still further embodiments, the edge portion of the front and back surfaces extend from the nearest peripheral edge point and a point between the nearest peripheral edge point and the central axis and between about 1 mm and about 15 mm from the nearest peripheral edge point.

In even further embodiments, the method further comprises reducing the flatness of the edge-etched wafer by at least about 50%; contacting the peripheral edge, front surface, and back surface of the edge-etched wafer with a caustic etchant in the form of an aqueous solution comprising a source of hydroxide ions; polishing the front surface and back surface of the edge-etched wafer; and polishing the peripheral edge of the edge-etched wafer.

The present disclosure is further directed to a silicon wafer comprising a central axis, a front surface and a back surface that are generally perpendicular to the central axis, a radius, R, extending from the central axis to a point along the peripheral edge, a point along the peripheral edge nearest the central axis, edge portions of the front and back surfaces of the wafer that extend from the nearest peripheral edge point to a point between the nearest peripheral point and the central axis and no more than about 15 mm from the nearest peripheral edge point, and central portions of the front and back surfaces of the wafer that extend from the point between the nearest peripheral point and the central axis and the central axis. The front and back surfaces of the wafer have a total thickness variation of at least 20 microns. The central portions of the front and back surfaces of the wafer have a surface roughness of at least about 0.3 μm Ra. The edge portions of the front and back surfaces of the wafer have a surface roughness of less than about 0.3 μm Ra.

In another aspect of the present disclosure a silicon wafer comprises a central axis, a front surface and a back surface that are generally perpendicular to the central axis, a radius, R, extending from the central axis to a point along the peripheral edge, a point along the peripheral edge nearest the central axis, edge portions of the front and back surfaces of the wafer that extend from the nearest peripheral edge point to a point between the nearest peripheral point and the central axis, and central portions of the front and back surfaces of the wafer that extend from the point between the nearest peripheral point and the central axis and the central axis. The front and back surfaces of the wafer have a total thickness variation of at least 20 microns. The central portions of the front and back surfaces of the wafer have a surface roughness of at least about 0.3 μm Ra. The edge portions of the front and back surfaces of the wafer have a surface roughness of less than about 0.2 μm Ra.

The present disclosure is also directed to an edge etching apparatus that comprises a casing and a plurality of rollers disposed within the casing. Each roller includes a central axis and a plurality of annular grooves in generally parallel alignment with the annular grooves of each adjacent roller.

BRIEF DESCRIPTION OF THE DRAWINGS

Corresponding reference characters indicate corresponding parts throughout the drawings.

DETAILED DESCRIPTION

The present disclosure provides a method for treatment of an edge portion of a silicon wafer with an acidic or caustic etchant. In accordance with the present disclosure, the edge of the wafer is etched to remove wafer damage caused by prior treatment (e.g., edge grinding). In particular, the method of the present disclosure involves treating the edge of the wafer prior to any significant reduction in flatness of the wafer. For example, in various embodiments of the present disclosure the edge etching operation is conducted prior to a lapping or grinding operation (e.g., prior to reducing the flatness of the wafer by at least about 50% as measured by the GBIR method).

In one embodiment, treating an edge portion of the wafer includes contacting a portion of the front and/or back surface of the wafer with the caustic etchant and, in another embodiment, with an acidic etchant. It should be noted that use of a caustic or an acidic etchant may degrade the flatness of the wafer edge and any other portion of the wafer surface contacted with the etchant. However, this potential negative of the edge etching operation may be addressed by conducting the edge etching operation prior to flatness treatment of the wafer, which is suitable for addressing any wafer flatness degradation caused by edge etching (e.g., double-sided polishing).

Figure 1:
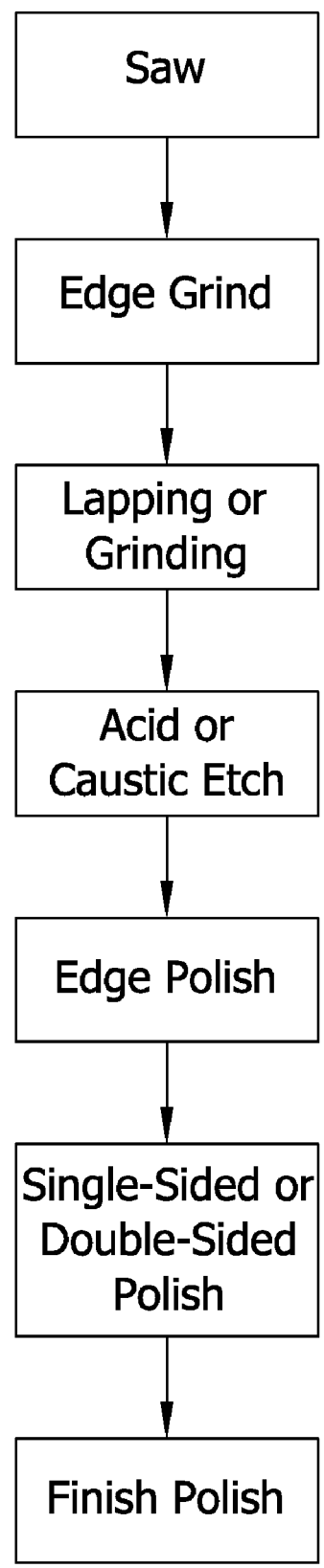
FIGS. 1 and 2 are block diagrams illustrating processing steps in traditional wafer processing.
Figure 2:
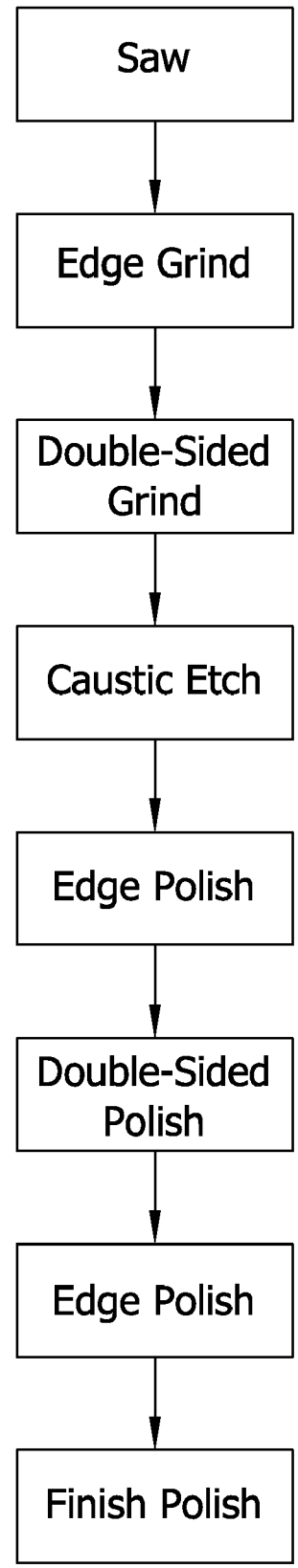

FIG. 1 depicts a traditional wafer processing flow. As shown, the surface of the wafer is etched (acidic or caustic) to remove mechanical damage to the wafer during wafer shaping operations (e.g., the wafer lapping and/or grinding operation), and to remove edge damage to the wafer caused during the edge grinding operation. Regardless of the particular etching operation, the etched wafer is typically subjected to an edge polishing operation, followed by a double-sided polishing operation. As noted, double-sided polishing operations generally do not treat the edge of the wafer surface. FIG. 2 depicts an additional example of conventional wafer processing flow in which a wafer is treated by a double-sided grinding operation, caustic etching, followed by edge polishing.

Figure 3:
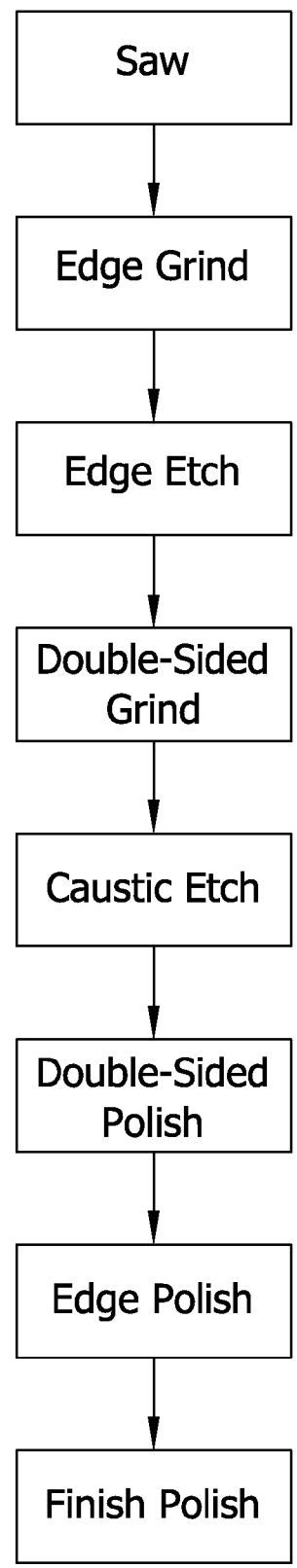
FIG. 3 is a block diagram illustrating processing steps in a wafer processing method of one embodiment of the present disclosure.

FIG. 3 depicts one embodiment of a wafer processing flow in accordance with the present disclosure. As shown, the wafer is subjected to edge etching prior to double-sided grinding flatness treatment. As noted, wafer surface damage caused by edge etching is addressed by subsequent wafer treatment. In addition, edge etching in accordance with embodiments of the present disclosure provides advantages over prior edge treatment methods, including edge polishing as shown in FIG. 2. Namely, as previously noted, conventional edge polishing operations generally require multi-step treatment of the wafer that increases wafer processing time and cost whereas the edge etching process of embodiments of the present disclosure is simpler and more economical than these conventional edge polishing operations. For example, equipment and material costs of the edge etching method are generally lower than those associated with conventional multistage edge polishing operations.

In addition, the method of the present disclosure avoids excessive material costs as the entire wafer surface is not contacted with the etchant. Moreover, as noted elsewhere herein, the present method avoids the need for separation of stacked wafers upon completion of edge etching associated with various conventional edge etching operations that is often difficult and/or time-consuming. The edge etching methods disclosed herein may also reduce edge polishing times thus increasing throughput of the treatment process.

An edge portion of a silicon wafer surface to be treated by the present method is generally contacted with an etchant by immersing the edge portion of the wafer in the etchant. In various embodiments, the wafer is rotated to continuously contact an edge portion of the wafer by immersing the edge portion in a bath comprising the etchant. For example, an edge portion may be contacted with the etchant by rotating a wafer around an axis generally parallel to a top surface of the etchant or a bath comprising the etchant (e.g., around an axis generally parallel to the etchant or bath or at an angle ranging from 0° to 89°, with respect to a top surface of the etchant or bath). For example, the wafer is typically rotated about an axis oriented at an angle from about 0° to about 60°, from about 0° to about 40°, from about 0° to about 20°, or from about 0° to about 10° with respect to a top surface of the etchant.

I. Starting Material

The processes of embodiments of the present disclosure generally employ as a starting material a silicon wafer that has been sliced from a single crystal silicon ingot and further processed, for example, using conventional grinding apparatus to profile and/or chamfer the peripheral edge of the wafer. This processing reduces the risk of wafer damage during further processing, reduces the non-uniform damage caused by the slicing process and roughly improves the general flatness and parallelism and flatness of the front and back surfaces. The wafer may be sliced from the ingot using any means known to persons skilled in the art, such as, for example, an internal diameter slicing apparatus or a wiresaw slicing apparatus. Wafer slicing and grinding processes are well-known to those skilled in the art.

Regardless of the precise combination of prior processing, the silicon wafer starting material may have any conductivity type, resistivity, diameter, crystal orientation and target thickness appropriate for the intended semiconductor application. For example, the wafer diameter is generally at least about 100 mm and may be about 150 mm, about 200 mm, about 300 mm, about 450 mm or greater, and the thickness of the wafer may be from about 475 µm to about 900 µm or greater, with the thickness typically increasing with increasing diameter. Stated another way, the radius of the wafer may be at least about 25 mm or at least about 50 mm, and even may be about 75 mm, about 100 mm, about 150 mm, about 225 mm or greater. The wafer may have any crystal orientation including, for example, <100>, <110>, and <111> crystal orientations.

II. Edge Etching

Generally, the methods of embodiments of the present disclosure comprise treating the peripheral edge and an edge portion of a silicon wafer by removing silicon from the peripheral edge and the edge portion of the wafer to provide a smooth edge surface. Typically, a point along the peripheral edge of the wafer nearest the central axis is defined by a notch.

As used herein, the term "notch depth" refers to that point along the radius toward the central axis to which an orientation notch extends. In accordance with these embodiments, an edge portion of the wafer contacted with the etchant is defined by the peripheral edge of the wafer and a point between the notch depth and the central axis (e.g., a point no more than about 15 mm from the peripheral edge, between about 1 mm and about 15 mm from the peripheral edge, or from the peripheral edge point nearest the central axis within any of the above-noted limits).

Figure 4:
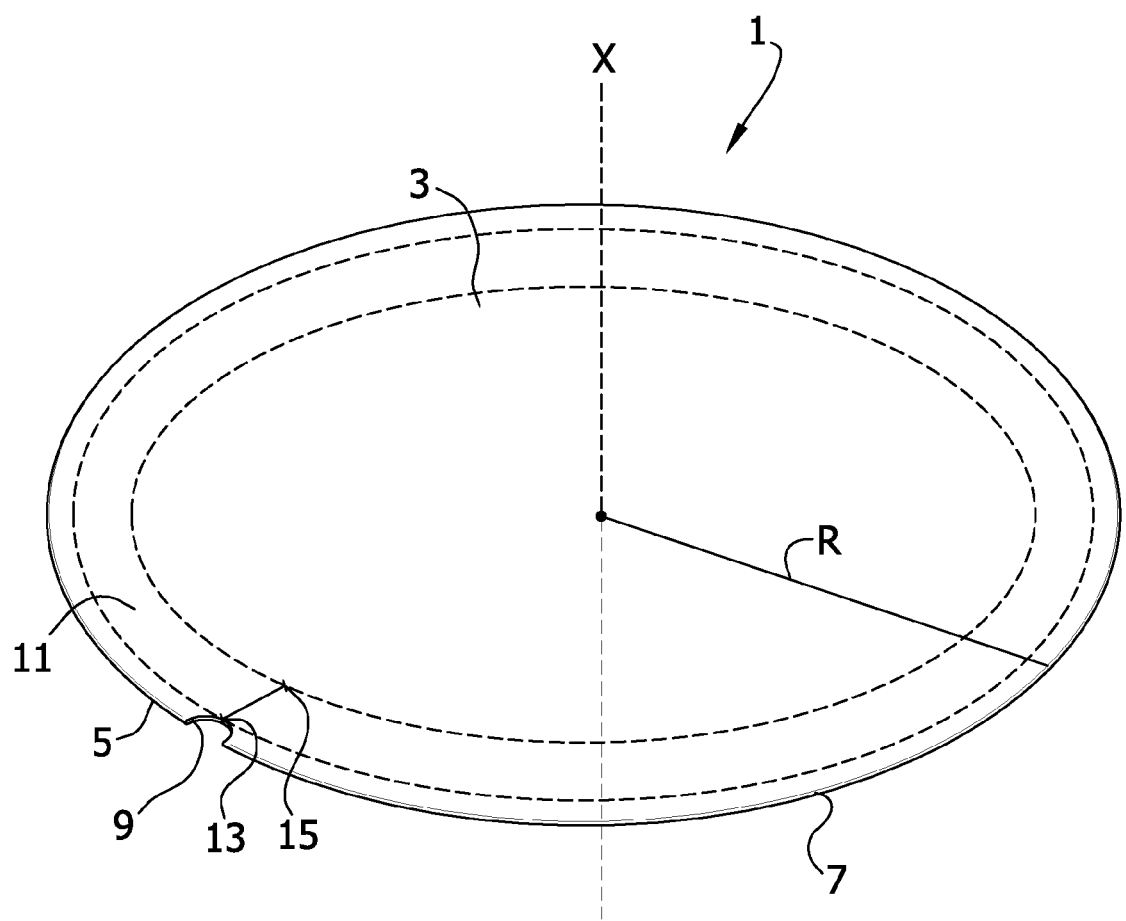
FIG. 4 is a perspective of a wafer that may be treated by the method of the present disclosure.

Referring now to FIG. 4, silicon wafers treated by the present method generally include a central axis X, a front surface 3 and a back surface 5 that are generally perpendicular to the central axis, and a radius (R) extending from the central axis to a point on the peripheral edge of the wafer. The wafer also includes a peripheral edge 7 and an edge portion 11. The edge portion extends from the peripheral edge point 13 most near the edge 7 to a second point 15 that is more near the central axis than the peripheral edge point 13. The points may extend around the wafer to form a circle, and are depicted in FIG. 4 as dashed line circles.

The wafers to be treated also generally include one or more flats or orientation notches 9 at the peripheral edge 7 of the wafer 1. The peripheral edge may include a plurality of flats, but generally includes one point along the peripheral edge of the wafer 1 nearest to the central axis X. The edge portion 11 of the wafer surface contacted with the etchant corresponds to a portion of the wafer surface extending from the point along the peripheral edge nearest the central axis to a point between the nearest peripheral edge point and the central axis. Generally, the edge portion is defined by a point no more than about 15 mm from the nearest peripheral edge point. In various embodiments, the edge portion is defined by a point no more than about 12 mm, no more than about 10 mm, no more than about 8 mm, or no more than about 6 mm from the nearest peripheral edge point (e.g., a point no more than about 5 mm, no more than about 4 mm, no more than about 3 mm, no more than about 2 mm, or no more than about 1 mm from the nearest peripheral edge point). The edge portion contacted with the etchant generally includes the peripheral edge of the wafer and a portion of the front surface and back surface of the wafer.

In these and various other embodiments, the edge portion of the wafer surface is defined by a point between about 1 mm and about 15 mm from the nearest peripheral edge point, between about 1 mm and about 12 mm from the nearest peripheral edge point, or between about 1 mm and about 10 mm from the peripheral edge point. Typically, the edge portion is defined by a point between about 1 mm and about 8 mm from the nearest peripheral edge point, more typically between about 1 mm and about 6 mm from the nearest peripheral edge point and, more typically, between about 1 mm and about 5 mm from the nearest peripheral edge point (e.g., between about 1 mm and about 4 mm, between about 1 mm and about 3 mm, or between about 1 mm and about 2 mm from the nearest peripheral edge point).

Figure 5:
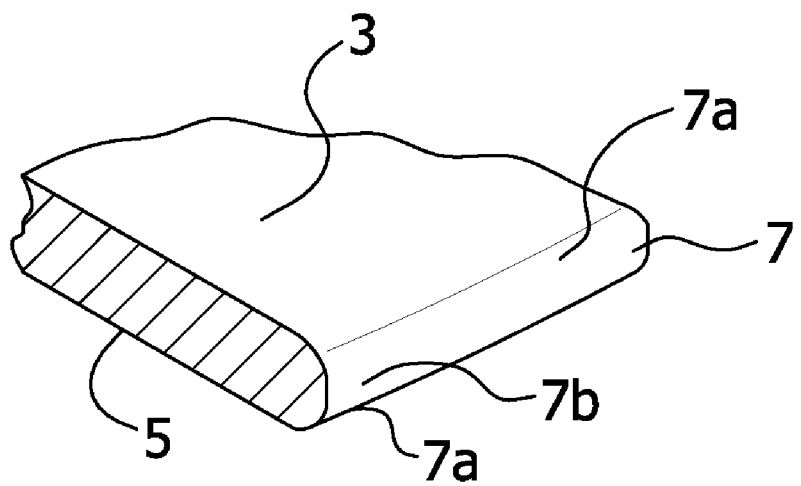
FIG. 5 is a partial perspective of the wafer of FIG. 4 with a portion of the wafer cut away.

As shown in FIG. 5 the edge 7 of the wafer includes two bevels 7a and an apex 7b intermediate the bevels.

As noted, contact of an edge portion of the wafer surface with the etchant includes contact of the peripheral edge and a portion of the front and/or back surface of the wafer. However, contact of a substantial portion of the wafer surface (e.g., total submersion of the wafer) is generally avoided to minimize unnecessary consumption of etchant. In this regard it is to be noted that the radial distance to which the front surface and back surface are contacted with etchant are generally similar, but may vary based on processing conditions and apparatus limitations.

Processes of embodiments of the present disclosure are generally conducted by immersing an edge portion of one or more wafers in a bath, or pool of etchant. Other processes are contemplated within the scope of this disclosure. Generally one or more wafers are positioned so that rotation of the wafer(s) immerses them in a pool, or bath, of etchant. As previously noted, conventional edge polishing typically involves a multi-step operation. Process of embodiments of the present disclosure is a single-step operation and may be easily incorporated into the overall silicon wafer processing operation including, for example, between wafer shaping operations (e.g., edge grinding) and caustic etching of the wafer surface as shown in FIG. 3. It is to be further noted that the present process provides a further benefit with respect to process efficiency since it is amenable to concurrent treatment of a plurality of wafers. More particularly, the present process may be easily adapted to treatment of edge portions of at least 2, at least 4, at least 5, at least 6, at least 8, at least 10, or more wafers. For example, the present process may be adapted to treatment of at least 10 wafers, at least 20 wafers, at least 30 wafers, at least 40 wafers, or at least 50 wafers.

In one embodiment, wafers undergo a light caustic etch immediately proceeding or immediately following the edge etch. The light caustic etch relieves stress in the wafer and helps prevent any bowing or warp caused by the edge etch. The light etch may remove from about 0.5 µm to about 2 µm and more typically from about 0.8 µm to about 1.2 µm of material from the surfaces of the wafer. In another embodiment, the wafers undergo a double-sided grind following the edge etch to reduce the wafer flatness.

III. Edge Etching Apparatus

Figure 6:
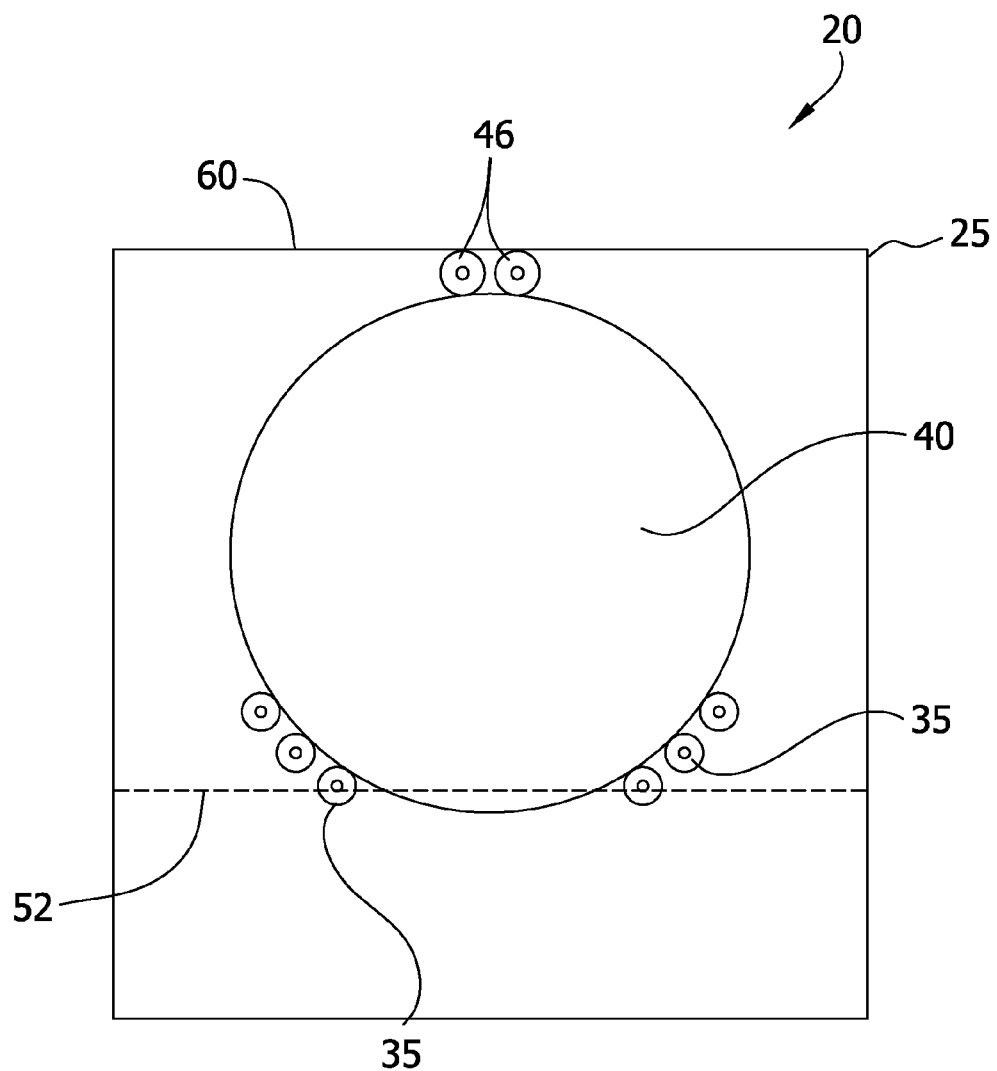
FIG. 6 is a side view of an edge etching apparatus according to one embodiment of the present disclosure.

FIGS. 6-9 illustrate one embodiment of an edge etching apparatus or etcher 20 suitable for use in the processes of the present disclosure. As shown in FIG. 6 the edge etcher 20 generally includes a casing 25. Within the casing 25 are rollers 35 that may support a number of wafers 45. It is to be understood that rollers 35 may be located in various other arrangements besides that shown in FIG. 6. For example, the etcher 20 may include more, or less, rollers 35 than depicted in FIG. 6. In addition, the etcher may include one continuous section of rollers around an outer edge of the wafer 45 (e.g., rollers extending between the sections of rollers 35 shown in FIG. 6). A driving mechanism (not shown) drives rotation of the rollers 35. The driving mechanism may include a gear that rotates to drive each of the rollers of the edge etching apparatus. The gear may be driven by, for example, an electric motor.

The apparatus 20 may also include top rollers 46 within the casing 25. The top rollers 46 help the wafer 45 to more precisely rotate about its axis. For purposes of the present disclosure, "top rollers" includes rollers positioned to engage wafers at a point on the uppermost 180 degrees of the wafer circumference. The top rollers 46 may adjustably move up and down relative to the casing 25 such that the top rollers "float" above the wafers 45. Weights may be attached to the top rollers 46 to assist the rollers in engaging and securing the wafers 45. The upper rollers 46 may be attached to a lid 60 that may open and shut as appropriate for loading and unloading of wafers.

Figure 7:
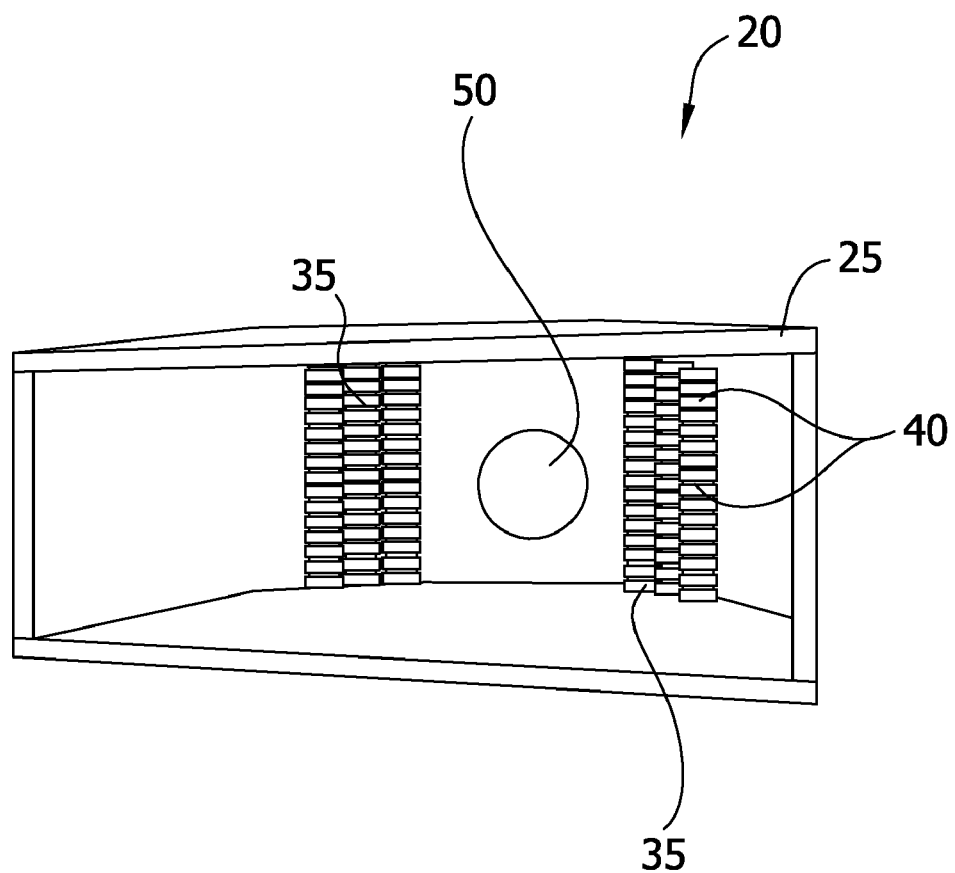
FIG. 7 is a top view of the edge etching apparatus of FIG. 6 illustrating the apparatus without wafers.
Figure 8:
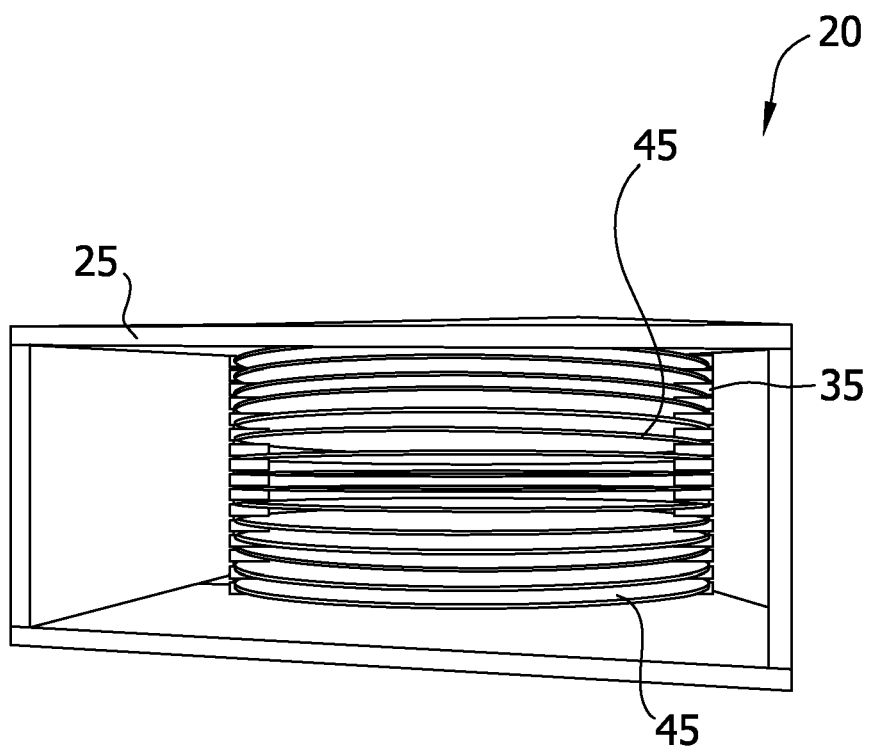
FIG. 8 is a top view of the edge etching apparatus of FIG. 6 illustrating the apparatus with wafers loaded therein.
Figure 9:
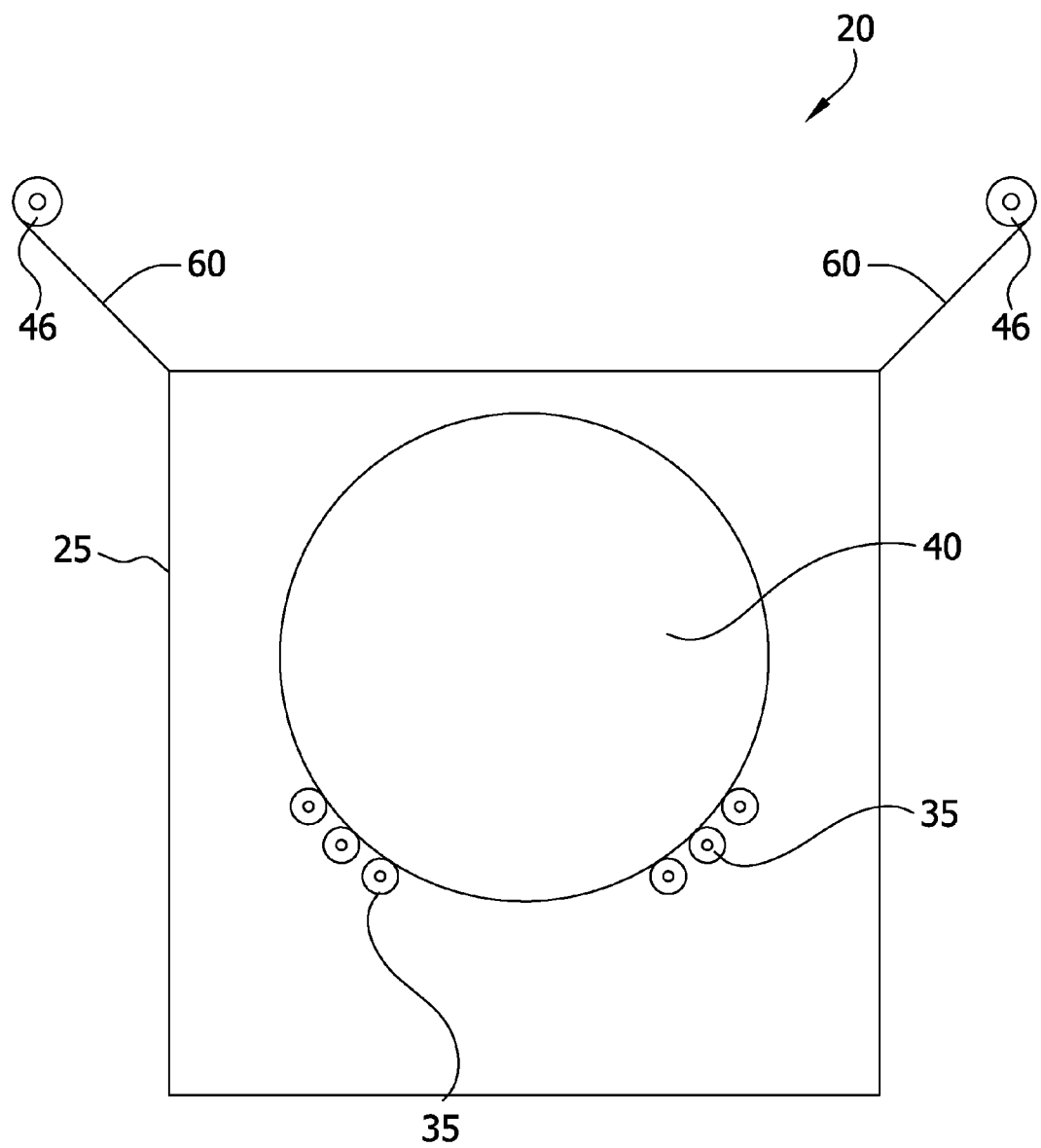
FIG. 9 is a side view of the edge apparatus of FIG. 6 illustrating the apparatus with a lid in an open position.

FIG. 7 is a top view of the etching apparatus 20 without wafers loaded therein. Further, the etching apparatus 20 is illustrated without a lid and top rollers for purposes of illustration. As shown, each of the rollers 35 include grooves 40 that are generally in alignment with the grooves of adjacent rollers 35. In this manner, multiple wafers in generally parallel alignment may be secured by the rollers. The casing 25 may include an opening 50. A valve (not shown) may be formed within the opening 50 to regulate the flow of etchant into and out of the casing 25. FIG. 8 is a top view of the etching apparatus 20 including a plurality of wafers 45 secured by the roller/groove arrangement shown in FIG. 7. FIG. 9 is a side view of the apparatus 20 illustrating the apparatus with a lid 60 open. The top rollers 46 are attached by suitable means to the lid 60.

In conventional apparatus, one must separate each wafer after etching from a stack of wafers. This process can be labor-intensive, difficult and time consuming. Use of the etching apparatus 20 as depicted in FIGS. 6-9 eliminates this separation step.

In one embodiment of a method of this disclosure, wafers are added to the edge etching apparatus 20 such that the wafers are pinched between the grooves 40 of the rollers 35. The lid 60 is closed to seat the wafers 45 in the grooves of top rollers 46. For contact of the wafers 45 with the etchant, the edge etching apparatus 20 may be immersed in a pool of etchant (not shown) to cause etchant to enter the etching apparatus through the opening 50 shown in FIG. 7. Alternatively, etchant may be introduced directly into the casing 25 through a second opening (not shown). The valve within the opening 50 is closed to cause the etchant level to rise until etchant contacts the edge of the wafers 45 (FIG. 6). The final etchant level is designated by dashed line 52.

The depth of the reservoir of etchant in the etching apparatus is determined by the amount of etchant in the pool of etchant, the depth to which the etcher is immersed in the pool and/or the amount of etchant directly added into the casing 25. The apparatus 20 may also include an overflow hole (or "slot" or "weir") (not shown) with the lowest point of the overflow hole defining the depth of etchant in the apparatus. In one embodiment, etchant that exits the overflow hole may be returned back to the apparatus 20.

The depth of etchant in the edge etching apparatus 20 generally corresponds to the distance from the peripheral edge along the radius of the wafer to which the wafer is contacted with the etchant.

Once the etcher is immersed in the etchant, the rollers 35 are driven by a central gear (not shown) to rotate the wafers and immerse the wafers in the pool, or bath, of etchant.

After etching, the apparatus 20 may be removed from the pool of etchant. In embodiments, where etchant is added directly to the casing 25, the valve in the opening 50 may be opened to cause etchant to exit or be expelled from the casing. The lid 60 is opened and the wafers 45 may be removed from the etching apparatus 20.

Figure 11:
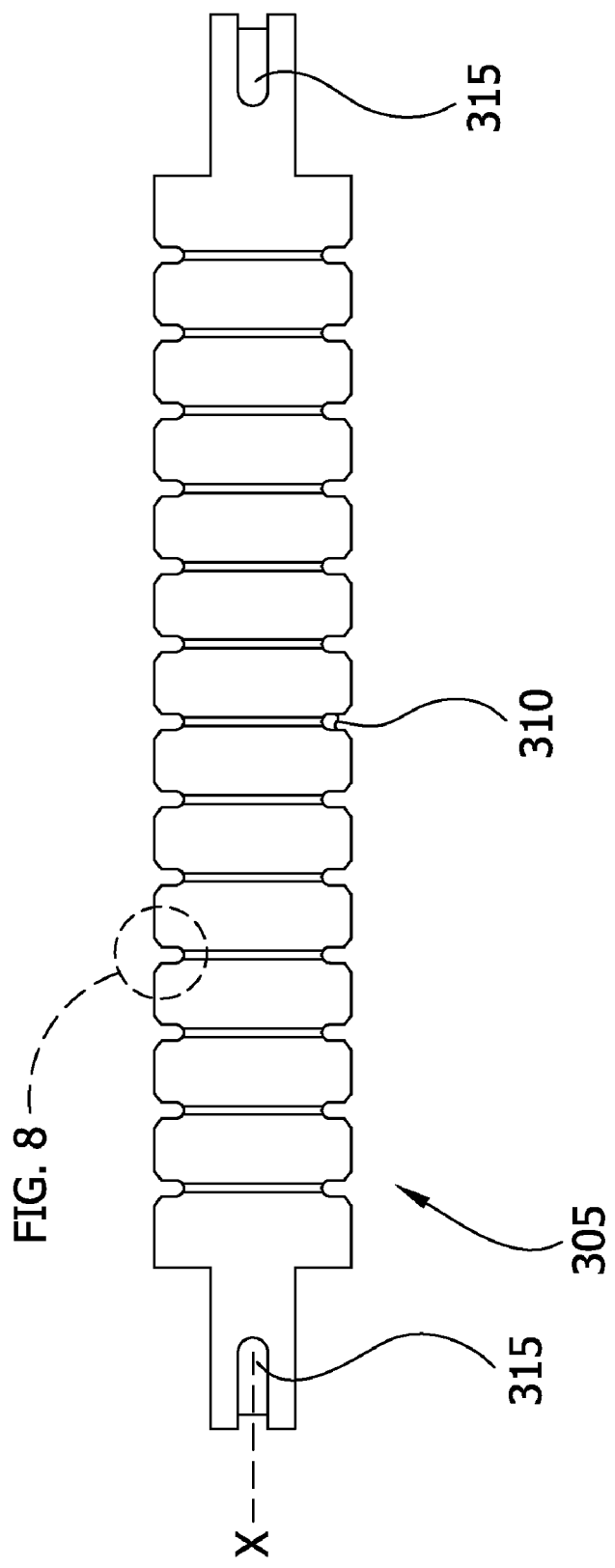
FIG. 11 is a side view of a roller of one embodiment of the present disclosure.
Figure 17:
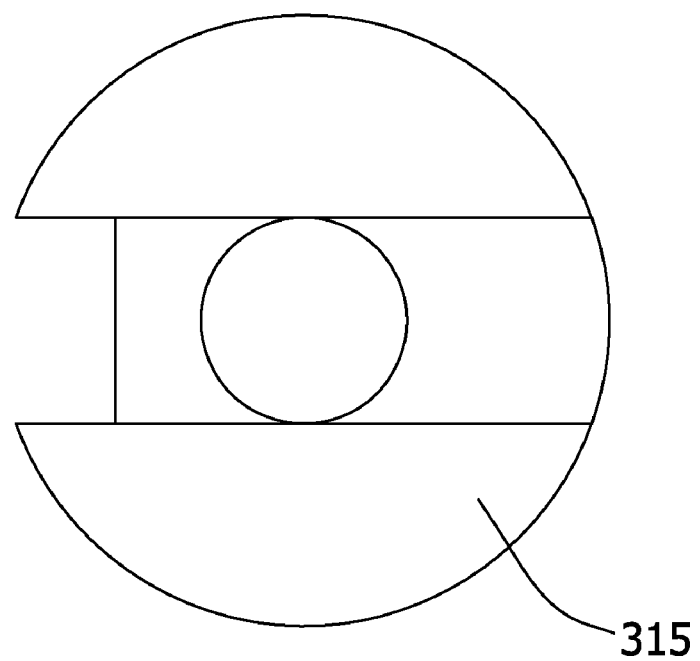
FIG. 17 is an end view of the roller of FIG. 11.

FIG. 11 depicts a roller 305 that may be used in the edge etching apparatus as depicted in FIGS. 6-9 and may also be used in various other embodiments. The roller 305 shown in FIG. 11 includes a central axis X and includes a plurality of annular grooves 310 about the axis X. As shown in FIG. 11, each roller 305 includes ends 315. A side view of an end 315 is illustrated in FIG. 17.

Figure 12:
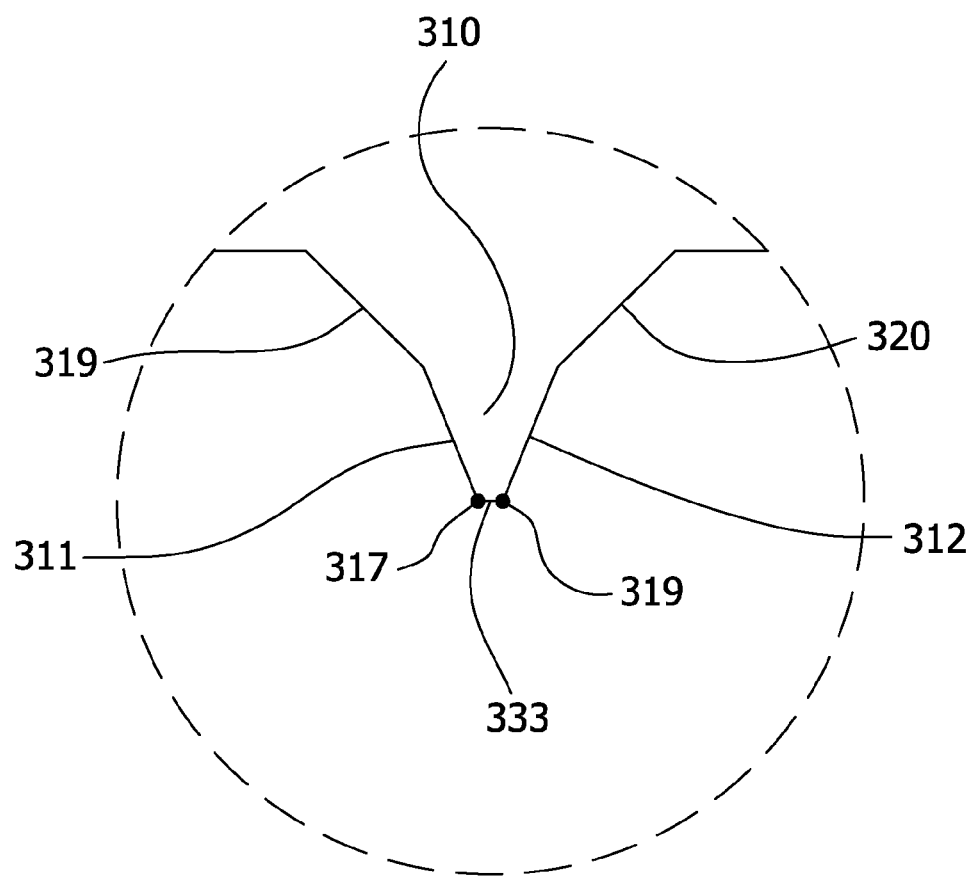
FIG. 12 is an enlarged side view illustrating a groove of the roller of FIG. 11.

FIG. 12 shows the annular groove 310 of the roller 305 shown in FIG. 11. The annular groove 310 is defined by a first annular edge 311 and a second annular edge 312. Both edges 311, 312 extend radially inward towards the central axis of the roller. As can be seen from FIG. 12, as the first and second annular edges 311, 312 extend radially inward, the first annular edge and the second annular edge extend axially toward each other. The first annular edge 311 has a most radially inward point 317 and the second annular edge 312 also includes a most radially inward point 319.

Figure 13:
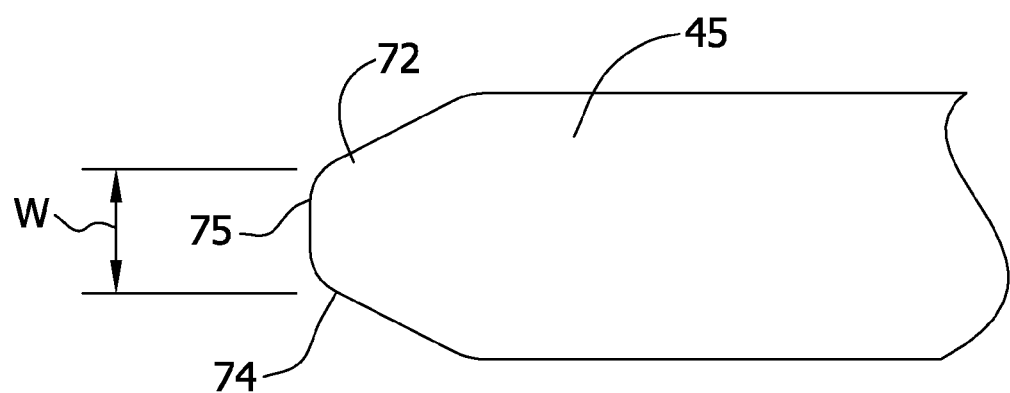
FIG. 13 is an enlarged side view of a wafer edge that may be treated by the method of the present disclosure.

FIG. 13 illustrates an edge of a wafer 45 according to one embodiment of the present disclosure. The illustrated wafer edge is known in the art as being "T-shaped" but other profiles including, for example, "R-shaped" profiles may be used without departing from the scope of the present disclosure. The edge 45 includes an upper bevel 72 and a lower bevel 74. Between the bevels 72, 74 is an apex 75. The apex 75 defines a width W.

Figure 14:
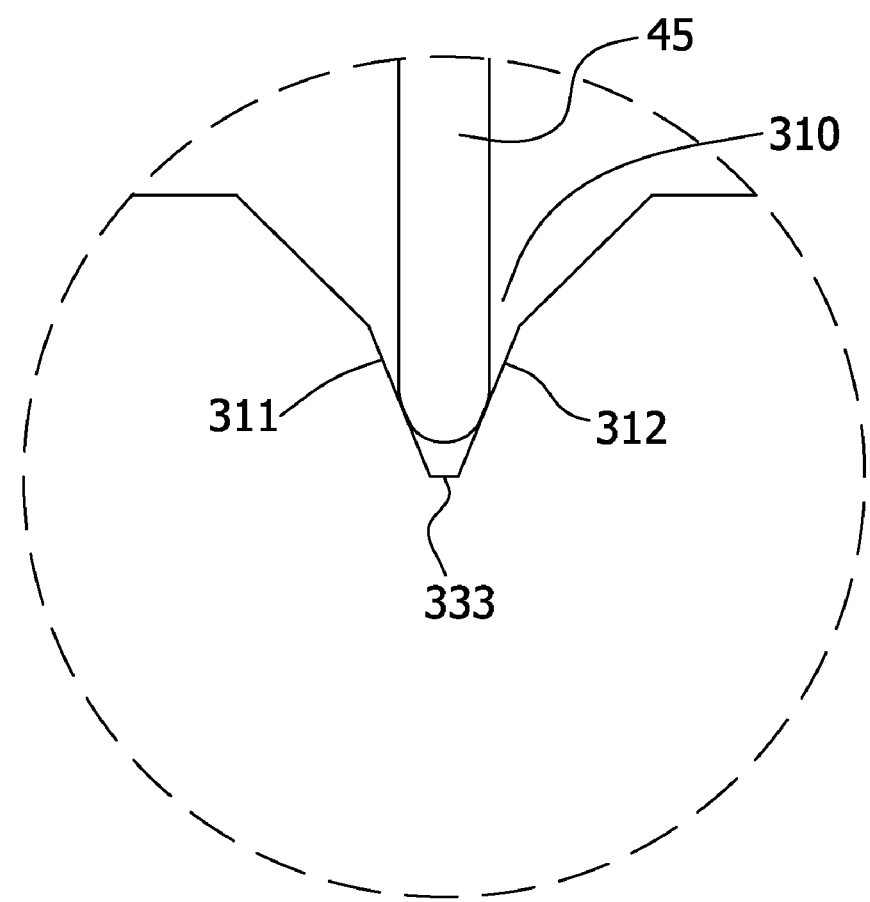
FIG. 14 is an enlarged side view illustrating a wafer engaged with the groove of FIG. 12.

In one embodiment, the distance between the most radially inward point 317 and the most radially inward point 319 of the grove 310 is less than an apex width W of the wafers that the grooves are sized and shaped to receive. As illustrated in FIG. 14, this arrangement allows the wafer 45 to become pinched within the taper of the groove which allows the wafer 45 to more precisely rotate about its axis. A more precise rotation results in a smoother etch about the circumference of the wafer 45.

In another embodiment, the distance between the most radially inward point 317 of the first edge 311 and the most radially inward point 319 of the second edge 312 is less than an average thickness of the wafer.

In one embodiment, the distance between the most radially inward point 317 of the first edge 311 and the most radially inward point 319 of the second edge 312 is less than 200 μm. In another embodiment, the distance is less than about 100 μm and, in other embodiments, from about 50 μm to about 200 μm or from about 50 μm to about 100 μm.

As illustrated in FIG. 12, a floor 333 extends between the most radially inward point 317 of the first edge 311 and the most radially inward point 319 of the second edge 312. The width of the floor 333 may be less than an apex width W of the wafers that the grooves are sized and shaped to receive (FIG. 14). The apex width W of the wafers may be determined by use of an edge profiling inspection tool. Suitable equipment for edge profile inspecting include the LEP-2200 Edge Profile Monitor (Kobelco, Japan).

In one embodiment, the width of the floor is from about 50 μm and about 200 μm and, in another embodiment, from about 50 μm and about 100 μm.

Figure 15:
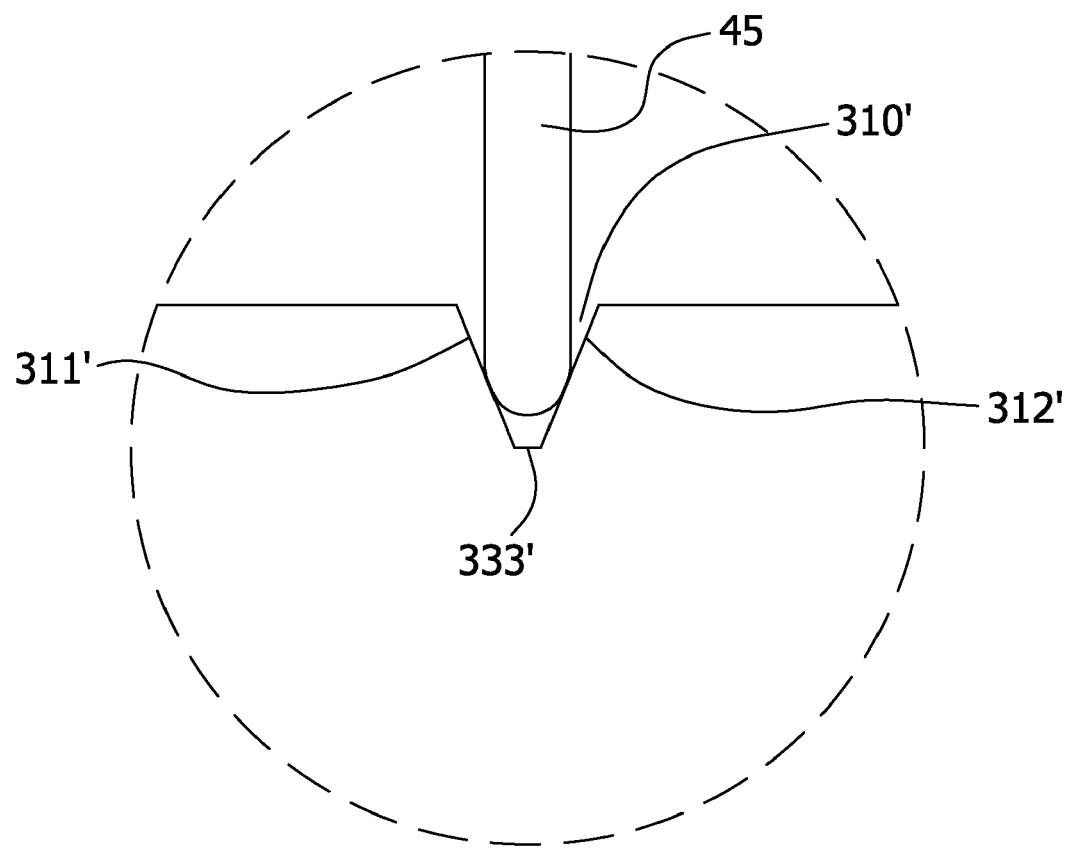
FIG. 15 is an enlarged side view illustrating a wafer engaged with a groove according to a second embodiment of the present disclosure.

The groove 310 may also include a third annular edge 319 and a fourth annular edge 320. In one embodiment and as illustrated in FIG. 15, the groove does not include the third edge and fourth edge but rather only includes a first edge 311' and second edge 312'.

Figure 16:
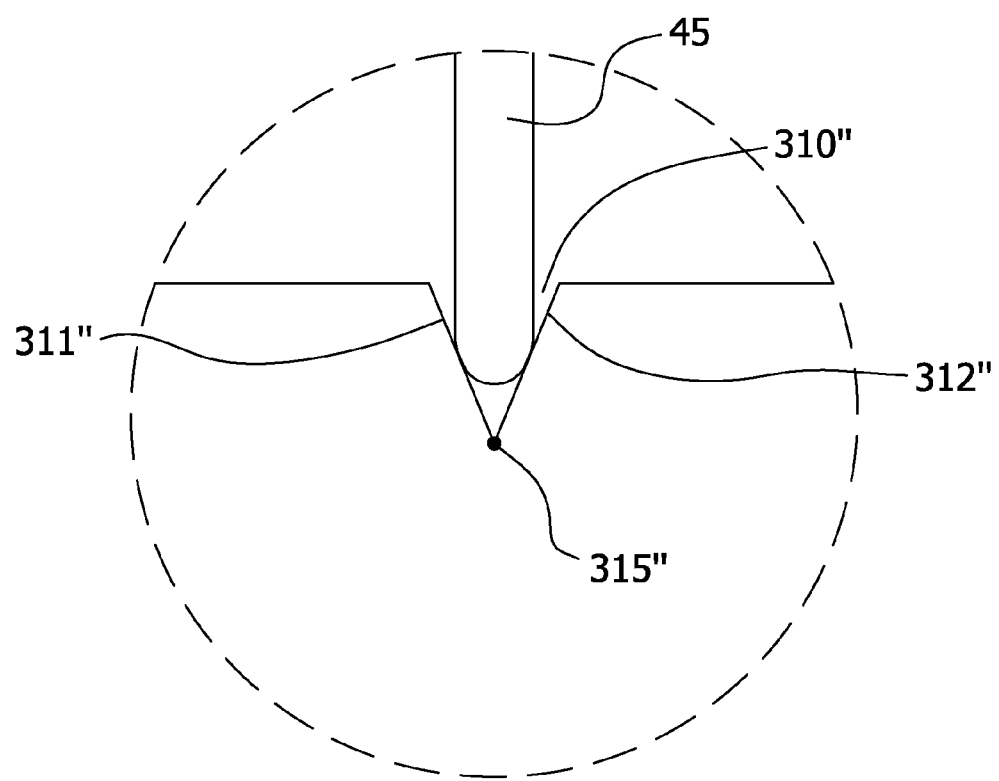
FIG. 16 is an enlarged side view illustrating a wafer engaged with a groove according to a third embodiment of the present disclosure.

Referring now to FIG. 16, in one embodiment, the first edge and the second edge intersect to form a vertex point 315". The vertex point 315" defines the most radially inward point of the first edge 311" and the most radially inward point of the second edge 312".

Figure 18:
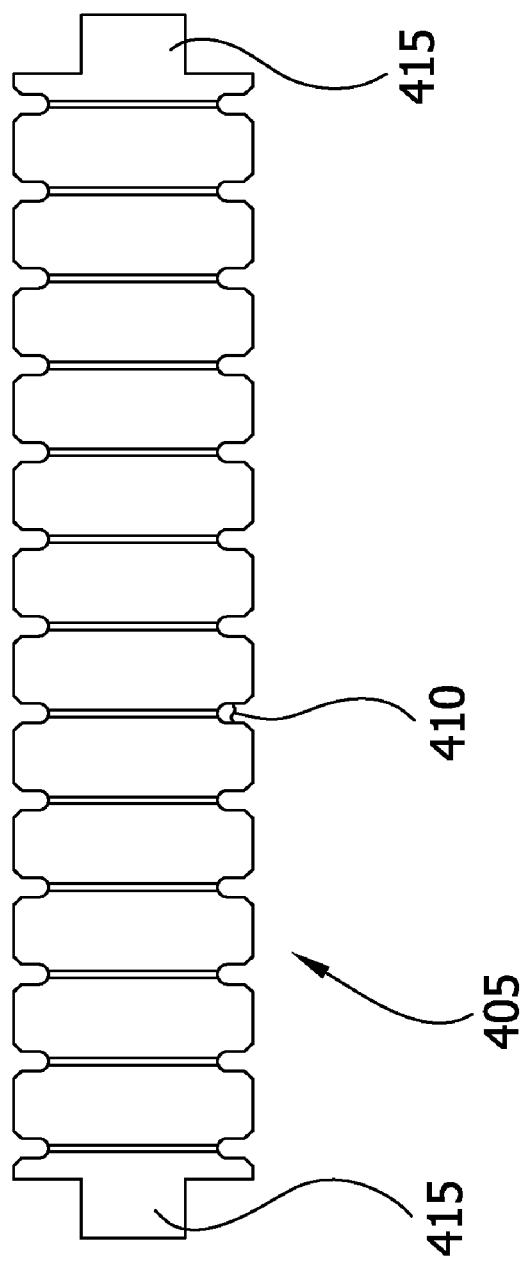
FIG. 18 is a side view of a roller of a second embodiment of the present disclosure.
Figure 19:
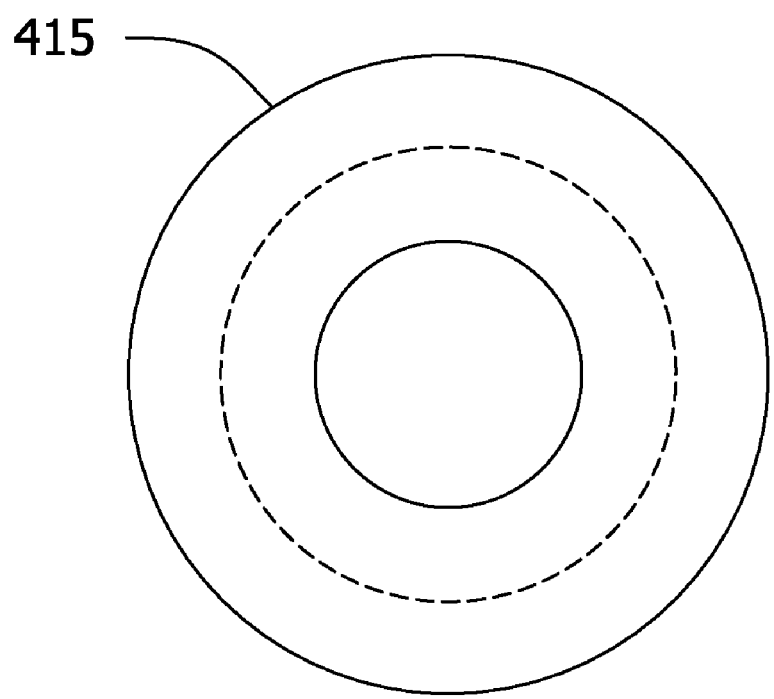
FIG. 19 is an end view of the roller of FIG. 18.

FIG. 18 illustrates a roller 405 that may be used in an edge etching apparatus as depicted in FIGS. 6-9 and in various other embodiments. The roller 405 includes an end 415 that differs in design from the end 315 of FIG. 11. The roller 405 includes grooves 410. The grooves 410 may have the same configuration as any one of the grooves illustrated in FIGS. 14-16.

The conditions of edge etching may be selected by one skilled in the art depending on the particular circumstances (e.g., the number of wafers to be treated and the desired characteristics of the edge-etched wafer(s)). For example, generally the one or more wafers are rotated at a rate that prevents etchant from flowing inward beyond the edge portion to the inner, or central portion of the wafer surface (e.g., at least about 10 revolutions per minute (rpm)), but generally below rates that may result in equipment damage and/or movement of wafers (e.g., speeds in excess of about 200 rpm). Thus, generally the wafers are rotated at a rate of at least about 10 revolutions per minute (rpm), at least about 20 rpm, at least about 30 rpm, at least about 50 rpm, at least about 75 rpm or even at least about 90 rpm. Typically, the wafers are rotated at a rate of from about 10 rpm to about 60 rpm, from about 20 rpm to about 50 rpm, or from about 30 rpm to about 45 rpm. In other embodiments the wafers are rotated from about 75 rpm to about 125 rpm or from about 90 rpm to about 110 rpm. Other conditions may be used within the scope of this disclosure.

In one embodiment, the direction of rotation of the wafers may be reversed such that the wafers are rotated in both clockwise and counter-clockwise directions while being contacting with etchant. In one embodiment, the wafers are rotated in a clockwise direction for about 60 seconds at a speed of about 100 rpm and in a counter-clockwise direction for about 60 seconds at a speed of about 100 rpm.

The time for which the edge portion is immersed in the etchant may be selected in view of, for example, the starting edge surface roughness and/or the desired finished edge surface features. Regardless of the particular circumstances, the peripheral edge and edge portions of the wafer surface are generally immersed in the etchant for at least about 30 seconds, at least about 1 minute, at least about 2 minutes, at least about 3 minutes, at least about 4 minutes, or at least about 5 minutes. In accordance with these and various other embodiments, the peripheral edge and edge portions of the wafer are immersed in the etchant for no more than about 30 minutes, no more than about 20 minutes, or no more than about 10 minutes. For example, the peripheral edge and edge portions of the wafer may be contacted with the etchant for a time of from about 1 minute to about 20 minutes, from about 1 minute to about 15 minutes, or from about 2 minutes to about 10 minutes.

The amount of silicon removed from the peripheral edge and edge portions of the wafer surfaces varies depending on the particular circumstances and conditions, but generally processes of embodiments of the present disclosure provide sufficient removal to provide a peripheral edge and edge portions that are sufficiently smooth in view of the fact that double-sided polishing does not address edge roughness. Generally, the peripheral edge and edge portions of the wafer are immersed in the etchant for a time such that at least about 10 μm, at least about 20 μm, at least about 30 μm, at least about 40 μm, or at least about 50 μm of silicon, in terms of total thickness, is removed from the edge portions of the wafer surface. Typically, the peripheral edge and edge portions of the wafer are immersed in the etchant for a time such that from about 10 to about 100 μm, more typically from about 20 to about 90 μm and, still more typically, from about 30 to about 80 μm (e.g., from about 40 to about 60 μm of silicon), in terms of total thickness is removed from the edge portion of the wafer surface.

In one embodiment, the peripheral edge and edge portions of the wafer are immersed in the etchant for a time such that the diameter of the wafer is reduced by at least about 10 μm, at least about 20 μm, at least about 30 μm, at least about 40 μm, or at least about 50 μm. Typically, the peripheral edge and edge portions of the wafer are immersed in the etchant for a time such that the diameter of the wafer is reduced by from about 10 to about 100 μm, more typically from about 20 to about 90 μm and, still more typically, from about 30 to about 80 μm.

IV. Edge Etched Wafers

As noted elsewhere herein and depicted in FIG. 3, the edge etching method of embodiments of the present disclosure is conducted prior to wafer flatness treatment (e.g., lapping or grinding). Accordingly, edge etching is typically conducted prior to reducing the flatness of the front and back surface of a wafer cut from a silicon ingot by at least about 50%, at least about 60%, at least about 70%, at least about 80% and, even more typically, at least about 90% (e.g., at least about 95%) as determined by the GBIR method. Thus, generally front and back surfaces of the wafer to be edge-etched exhibit a total thickness variation of at least about 10 microns, typically at least about 20 microns and, more typically, at least about 25 microns. Edge etching may impact overall wafer flatness. Accordingly, the surfaces of edge-etched wafers typically exhibit total thickness variations in excess of 20 microns or in excess of about 25 microns (e.g., greater than about 30 microns, or greater than about 35 microns).

Wafer treatment processes that are performed after the edge etch such as, for example, grinding, double-sided polishing and/or finish polishing) typically reduce the flatness of the front surface of the wafer (as measured after being cut from the ingot and after the treatment process) by at about 50%, at least about 60%, at least about 70%, at least about 80% and, even, at least about 90% as determined by the GBIR method. In other embodiments, the flatness of the back surface of the wafer is reduced by the above-noted amounts.

Also shown in FIG. 3, edge etching of the present method is typically conducted prior to surface roughness treatment of the front and back surfaces of the wafer (e.g., acidic or caustic etching of the entire wafer surface). Accordingly, a portion of the front surface of edge-etched wafers and, particularly, the portions of the wafers not contacted with etchant (i.e., a central potion of the surfaces that extends from the most radially inward point to which etchant contacts the wafer and the central axis), will typically exhibit an average surface roughness of at least about 0.3 μm Ra (at least about 3 μm Rt), at least about 1 μm Ra (at least about 10 μm Rt), or at least about 1.5 μm Ra (at least about 15 μm Rt). Typically, the central portion of the front surface of the edge-etched wafer exhibits surface roughness of from about 0.3 to about 2.5 μm Ra (from about 3 to about 25 μm Rt), from about 0.7 to about 2 μm Ra (from about 7 to about 20 μm Rt), or from about 1 to about 1.5 μm Ra (from about 10 to about 15 μm Rt).

Additionally or alternatively, a portion of the back surface of edge-etched wafers (i.e., the corresponding central portion of the back surface of the wafer) typically exhibits an average surface roughness of at least about 0.3 μm Ra (at least about 3 μm Rt), at least about 1 μm Ra (at least about 10 μm Rt), or at least about 1.5 μm Ra (at least about 15 μm Rt). Typically, the central portion of the back surface of an edge-etched wafer exhibits surface roughness of from about 0.3 to about 2.5 μm Ra (from about 3 to about 25 μm Rt), from about 0.7 to about 2 μm Ra (from about 7 to about 20 μm Rt), or from about 1 to about 1.5 μm Ra (from about 10 to about 15 μm Rt). Regardless of the initial surface roughness of a portion of the front and/or back surface it is to be noted that edge etching in accordance with the present disclosure generally has little, if any effect on the roughness of these surfaces. For example, typically the surface roughness of either or both of a front and back surface changes by no more than about 5%, no more than about 2%, and preferably no more than about 1% (e.g., no more than about 0.5%).

Since edge etching removes edge damage, the edge surface roughness of edge-etched wafers is less than the overall front surface and back surface roughness. For example, the surface roughness of an edge portion of edge-etched wafers is typically less than about 1 μm Ra, less than about 0.5 μm Ra, less than about 0.3 μm Ra, less than about 0.2 μm Ra, or less than about 0.1 μm Ra. Typically, edge surface roughness of edge-etched wafers is from about 0.05 to about 1 μm Ra, from about 0.1 to about 0.6 μm Ra, or from about 0.2 to about 0.5 μm Ra.

In various embodiments, after edge etching is complete, typically the total thickness variation of the surfaces of the edge-etched wafer is reduced (e.g., by grinding or lapping) to less than about 3 microns, less than about 2 microns, or less than about 1 micron.

Figure 10:
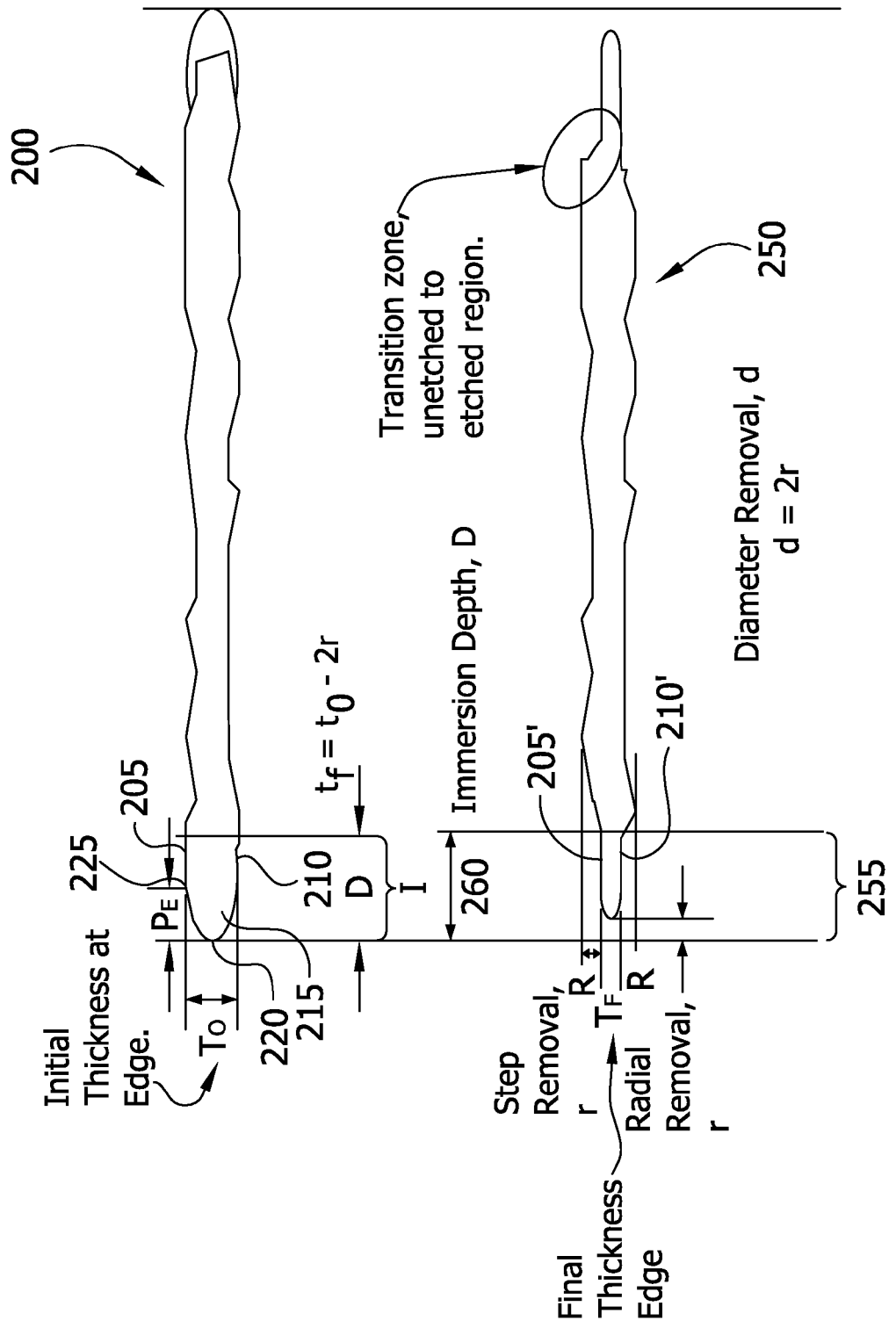
FIG. 10 schematically illustrates surfaces and thicknesses of a silicon wafer prior to edge etching and after edge-etching.

FIG. 10 illustrates a wafer 200 prior to edge etching having an initial thickness $T_0$ defined by a front surface 205 and a back surface 210. Wafer 200 also includes a notch 215 extending from the peripheral edge of the wafer 220 to a notch depth 225 defining an edge portion $P_e$ of the wafer surface. Wafer 200 also has an immersion region I extending from the peripheral edge 220 to a depth D that includes the edge portion $P_e$ of the wafer surface and a portion of the front surface 205 and back surface 210 of the wafer.

FIG. 10 also illustrates an edge-etched wafer 250 including an edge-etched region 255 that includes an etched notch portion 260 and an etched portion of the front surface 205' and an etched portion of the back surface 210'. Contact with the etchant provides silicon removal R from the front and back surface of the wafer for a total silicon removal from the immersion region of 2R and a final thickness of the immersion region of $T_f (T_0 - 2R)$.

V. Acidic Etchant

Acidic etchants suitable for edge etching in accordance with the present disclosure include those generally known in the art including, for example, those described in U.S. Pat. Nos. 3,964,957; 5,340,437; 5,211,794; 4,388,140; 5,236,548; 5,246,528; 4,971,645; 4,251,317; 4,849,701; 6,294,469; 5,233,218; 6,482,749; 6,046,117, the entire contents of which are incorporated herein by reference for all relevant purposes. Generally, the acidic etchant is in the form of an aqueous solution comprising a source of hydrogen ions. The source of hydrogen ions may be selected from the group consisting of hydrofluoric acid, nitric acid, phosphoric acid, acetic acid, sulfuric acid, hydrochloric acid, citric acid, oxalic acid, propionic acid, permanganic acid, and combinations thereof. Typically, the source of hydrogen ions is present in the etchant at a concentration of at least about 40 wt %, more typically at least about 50 wt %, still more typically at least about 60 wt % and, even more typically, at least about 70 wt % (e.g., at least about 80 wt %, or at least about 90 wt %).

In various embodiments, the acidic etchant consists essentially of water and the source of hydrogen ions. In various other embodiments, the acidic etchant comprises one or more additives along with the source of hydrogen ions. For example, the acidic etchant may comprise a surfactant selected from the group consisting of ammonium fluoroalkylsulfonate (e.g., Novec™ 4300), potassium perfluorooctanesulfonate, dodecylbenzene sulfonic acid, alkyl aryl sulfonic acid, and combinations thereof. In various embodiments the acidic etchant may comprise a fluorochemical surfactant (e.g., Fluorad® FC-95). Whether a surfactant is the lone additive, or other additives are included in the etchant, the volumetric ratio of additive to source of hydrogen ions is generally at least about 0.001:1, typically at least about 0.002:1 and, more typically, at least about 0.003:1. For example, in various embodiments the volumetric ratio of additive to source of hydrogen ions is from about 0.001 to about 1:1, from about 0.002:1 to about 0.5:1, or from about 0.003:1 to about 0.25:1.

VI. Caustic Etchant

Caustic etchants suitable for edge etching in accordance with the present disclosure include those generally known in the art including, for example, those described in U.S. Pat. Nos. 7,323,421; 6,110,839; 6,383,060; and 6,503,363, the entire contents of which are incorporated herein by reference for all relevant purposes. Generally, the caustic etchant is in the form of an aqueous solution comprising a source of hydroxide ions. The source of hydroxide ions generally comprises an alkali metal hydroxide selected from the group consisting of sodium hydroxide, potassium hydroxide, tetramethyl ammonium hydroxide, and combinations thereof.

EXAMPLES

Example 1

Evaluation of Edge Quality of Edge Etched Wafers

Edge portions of 15 P⁻ 300 mm wafers were etched utilizing an edge etcher of the type shown in FIGS. 6-9. The edge portions were immersed in a pool of 300 ml of acidic etchant from the following mixture: 2.4 l of $HNO_3$ (69 wt. %), 2 l of $H_3PO_4$ (85 wt %) and 0.55 l of HF (49 wt %).

Two runs were carried out, one in which an edge portion of 7 wafers were etched with the edge portion extended from the nearest peripheral edge point to a point approximately 8.5 mm from the nearest peripheral edge point. In the second run 8 wafers were etched with the edge portion extending to a point approximately 8.5 mm from the nearest peripheral edge point.

The etch time of the first, 7 wafer run was 300 seconds, with rotation reversal after 150 seconds. Silicon removal, based on OGP diameter (a comparison of wafer diameter prior to and after etching) was approximately 30 μm.

The etch time of the second, 8 wafer run was 360 seconds, with rotation reversal after an etch time of 150 seconds. Silicon removal, based on OGP diameter, was also approximately 30 μm.

Both runs were conducted at a wafer spin speed of from 25 to 30 rpm.

At the end of each etching cycle, the tank containing the pool of etchant was emptied and the wafers were rinsed with a spray of water for approximately 2 minutes to remove residual acid. The rinsed wafers were removed from the tank and dried. Wafers were then ground, double-sided polished, edge polished and evaluated for edge quality.

Edge quality, as measured by Chapman roughness was comparable to standard product. Edge measurements showed little residual damage.

Example 2

Determination of the Amount of Material Removed by Edge Etching 300 mm wafers (75) were cut from a single crystal silicon ingot. After edge grinding, the edge portions of the wafers were etched utilizing an edge etcher of the type shown in FIGS. 6-9.

The wafers were split into a first group of 39 wafers and a second group of 36 wafers. The first group of wafers was edge polished (EP-300-X, SpeedFam) for 11 seconds and the second group was edge polished for 8 seconds.

A third group (75) of wafers was cut from a single wafer and subjected to edge grinding and edge polishing (EP-300-X, SpeedFam). The edge polish was a conventional 13 seconds in length.

The edge etched wafers were then combined and double-sided polished. The wafers of the third group were also double-sided polished (AC-2000-P2, PeterWolters). The cassettes of all batches of wafers were combined and a finish polish was performed (LapMaster). The double-sided polish removed approximately 15 μm of material from the wafer surfaces.

The average diameter (OGP) of the edge etched wafers was 299.9946 mm after finish polishing and the average diameter (OGP) of the wafers that were not edge etched was 300.0211 mm after finish polishing. This corresponds to a 13.5 μm reduction in material from the wafer edge for edge etched wafers relative to edge polished wafers.

Example 3

Flatness Comparison between Wafers that were and were not Edge Polished

The flatness of the three batches of wafers of Example 2 was determined by both GBIR, SBIR and SFQR methods after finish polishing. The results are shown in Table 1 below.

TABLE 1

Flatness data for edge etched wafers and non-edge etched wafers after double-sided polishing and finish polishing

|  | Average | Average SBIR Max | Average SFQR Max |
| --- | --- | --- | --- |
| Non-Edge Etched (13 sec) | 308.7 | 118.7 | 29.8 |
| Edge Etched (11 sec) | 315.9 | 124.5 | 41.3 |
| Edge Etched (8 sec) | 299.8 | 108.5 | 37.0 |

As can be seen from Table 1, edge etching did not significantly degrade the flatness of finish polished wafers.

Example 4

Edge Quality Comparison between Wafers that were and were not Edge Polished

The edge quality of the wafers was then tested on a Raytex edge inspection system (Raytex-300) the system outputs were averaged for each group. The results of the analysis are shown in Table 2 below.

TABLE 2

Raytex measurements for edge etched and non-edge etched wafers after finish polishing

|  | Average DC | Average AC |
| --- | --- | --- |
| Non-Edge Etched (13 sec) | 488.3 | 145.3 |
| Edge Etched (11 sec) | 492.2 | 133.6 |
| Edge Etched (8 sec) | 491.7 | 130.1 |

As can be seen from Table 2, the DC output (which is indicative of the amount of pits/chips/bumps) was only slightly worse for etched wafers and the AC output for edge etched wafers (indicative of a smooth surface finish) was better than non-edge etched wafers.

The edge quality of the wafers was then determined by measuring the roughness by use of a Chapman profiler. The roughness was measured across the front bevel, back bevel and apex of the edge. The roughness was measured on three wafers from each batch at four points per wafer for a total of 12 points for each batch. The results were then averaged. The roughness measurements (Ra and RMS) are shown in Table 3.

TABLE 3

Ra and RMS edge roughness for edge etched wafers and non-edge etched wafers

| | Front Bevel Ra (average) | Front Bevel RMS (average) | Back Bevel Ra (average) | Back Bevel RMS (average) | Apex Ra (average) | Apex RMS (average) |
|---|---|---|---|---|---|---|
| Non-Edge Etched (13 sec) | 4.95 | 6.22 | 5.18 | 6.56 | 11.56 | 14.51 |
| Edge Etched (11 sec) | 5.22 | 6.47 | 5.10 | 6.46 | 10.35 | 12.89 |
| Edge Etched (8 sec) | 5.47 | 7.10 | 4.76 | 5.97 | 11.10 | 13.91 |

As can be seen from Table 3, edge etching does not significantly increase the roughness of the edge of the wafer.

The present disclosure is not limited to the above embodiments and can be variously modified. The above description of the embodiments, including the Examples, is intended only to acquaint others skilled in the art with the disclosure, its principles, and its practical application so that others skilled in the art may adapt and apply the disclosure in its numerous forms, as may be best suited to the requirements of a particular use.

With reference to the use of the word(s) comprise or comprises or comprising in this entire specification (including the claims below), unless the context requires otherwise, those words are used on the basis and clear understanding that they are to be interpreted inclusively, rather than exclusively, and applicants intend each of those words to be so interpreted in construing this entire specification.

When introducing elements of the present disclosure or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the disclosure are achieved and other advantageous results attained.

What is claimed is:

1. A method for removing silicon from a surface of a silicon wafer, the wafer comprising a central axis, a front surface and a back surface that are generally perpendicular to the central axis, a peripheral edge, a radius, R, extending from the central axis to a point along the peripheral edge of the wafer, a nearest peripheral edge point along the peripheral edge of the wafer nearest the central axis, and edge portions of the front and back surfaces of the wafer that extend from the nearest peripheral edge point to a point between the nearest peripheral edge point and the central axis and no more than about 15 mm from the nearest peripheral edge point, the method comprising:
   immersing and contacting with an etchant only (i) the peripheral edge of the wafer, (ii) the edge portion of the front surface of the wafer, and (iii) the edge portion of the back surface of the wafer, thereby producing an edge-etched wafer; and
   reducing the flatness of the front surface of the edge-etched wafer by more than about 50% by lapping or grinding.

2. The method of claim 1 wherein the edge portions of the front and back surfaces of the wafer extend from the nearest peripheral edge point to a point no more than about 10 mm from the nearest peripheral edge point.

3. The method of claim 1 wherein the edge portions of the front and back surfaces of the wafer extend from the nearest peripheral edge point to a point no more than about 4 mm from the nearest peripheral edge point.

4. The method of claim 1 wherein the edge portions of the front and back surfaces of the wafer extend from the nearest peripheral edge point to a point no more than about 1 mm from the nearest peripheral edge point.

5. The method of claim 1 wherein said contacting occurs prior to reducing the flatness of the front and back surfaces of the wafer by more than about 70%.

6. The method of claim 1 wherein R is at least about 150 mm.

7. The method of claim 1 wherein the peripheral edge and front and back edge portions of the wafer are contacted with the etchant by rotating the wafer.

8. The method of claim 1 wherein the wafer is rotated at a rate of at least about 10 revolutions per minute (rpm).

9. The method of claim 1 wherein the peripheral edge and front and back edge portions of the wafer are contacted with the etchant for at least about 1 minute.

10. The method of claim 1 wherein the rotation of the wafer is reversed to cause the wafer to be rotated in both a clockwise and counter-clockwise rotation while the peripheral edge and front and back edge portions of the wafer are contacted with the etchant.

11. The method of claim 1 wherein the peripheral edge and front and back edge portions of the wafer are contacted with the etchant for a time such that at least about 10 µm, in terms of total thickness, is removed from the front and back edge portions of the wafer.

12. The method of claim 1 wherein the peripheral edge and front and back edge portions of the wafer are contacted with the etchant for a time such that the diameter of the wafer is reduced by at least about 10 µm.

13. The method of claim 1 wherein peripheral edges and edge portions of a plurality of wafers are concurrently contacted with the etchant.

14. The method of claim 1 wherein the etchant is an acidic etchant in the form of an aqueous solution comprising a source of hydrogen ions.

15. The method of claim 14 wherein the etchant comprises a source of hydrogen ions selected from the group consisting of hydrofluoric acid, nitric acid, phosphoric acid, acetic acid, sulfuric acid, hydrochloric acid, citric acid, oxalic acid, propionic acid, permanganic acid, and combinations thereof.

16. The method of claim 14 wherein the etchant further comprises a surfactant selected from the group consisting of ammonium fluoroalkylsulfonate, potassium perfluorooctanesulfonate, dodecylbenzene sulfonic acid alkyl aryl sulfonic acid, and combinations thereof.

17. The method of claim 16 wherein the volumetric ratio of surfactant to the source of hydrogen ions is at least about 0.001:1.

18. The method of claim 1 wherein the etchant is a caustic etchant in the form of an aqueous solution comprising a source of hydroxide ions.

19. The method of claim 18 wherein the source of hydroxide ions is selected from the group consisting of sodium hydroxide, potassium hydroxide, tetramethyl ammonium hydroxide, and combinations thereof.

20. The method of claim 1 further comprising contacting the front surface of the wafer with a caustic etchant to relieve stress in the wafer.

21. The method of claim 20 wherein the caustic etchant removes from about 0.5 μm to about 2 μm of material from the surface of the wafer.

22. The method of claim 1 comprising grinding the front surface and back surface of the edge-etched wafers to reduce the flatness of the wafer.

23. A method for removing silicon from a surface of a silicon wafer, the wafer comprising a central axis, a front surface and a back surface that are generally perpendicular to the central axis, a peripheral edge, a radius, R, extending from the central axis to a point along the peripheral edge of the wafer, a nearest peripheral edge point along the peripheral edge of the wafer nearest the central axis, and edge portions of the front and back surfaces of the wafer that extend from the nearest peripheral edge point to a point between the nearest peripheral edge point and the central axis and no more than about 15 mm from the nearest peripheral edge point, the method comprising:
    contacting with an etchant (i) the peripheral edge of the wafer, (ii) the edge portion of the front surface of the wafer, and (iii) the edge portion of the back surface of the wafer, thereby producing an edge-etched wafer; and
    reducing the total thickness variation on the front surface of the edge-etched wafer to less than about 20 microns by lapping or grinding.

24. The method of claim 23 wherein R is at least about 150 mm.

25. The method of claim 23 wherein the peripheral edge and front and back edge portions of the wafer are contacted with the etchant by rotating the wafer.

26. The method of claim 23 wherein the peripheral edge and front and back edge portions of the wafer are contacted with the etchant for at least about 1 minute.

27. The method of claim 23 wherein the rotation of the wafer is reversed to cause the wafer to be rotated in both a clockwise and counter-clockwise rotation while the peripheral edge and front and back edge portions of the wafer are contacted with the etchant.

28. The method of claim 23 wherein the peripheral edge and front and back edge portions of the wafer are contacted with the etchant for a time such that at least about 10 μm, in terms of total thickness, is removed from the front and back edge portions of the wafer.

29. The method of claim 23 wherein the peripheral edge and front and back edge portions of the wafer are contacted with the etchant for a time such that the diameter of the wafer is reduced by at least about 10 μm.

30. The method of claim 23 wherein peripheral edges and edge portions of a plurality of wafers are concurrently contacted with the etchant.

31. The method of claim 23 further comprising contacting the front surface of the wafer with a caustic etchant to relieve stress in the wafer.

32. The method of claim 31 wherein the caustic etchant removes from about 0.5 μm to about 2 μm of material from the surface of the wafer.

33. The method of claim 23 comprising grinding the front surface and back surface of the edge-etched wafers to reduce the flatness of the wafer.

34. A method for removing silicon from a surface of a silicon wafer, the wafer comprising a central axis, a front surface and a back surface that are generally perpendicular to the central axis, a peripheral edge, a radius, R, extending from the central axis to a point along the peripheral edge of the wafer, a nearest peripheral edge point along the peripheral edge of the wafer nearest the central axis, and edge portions of the front and back surfaces of the wafer that extend from the nearest peripheral edge point to a point between the nearest peripheral edge point and the central axis and no more than about 15 mm from the nearest peripheral edge point, the method comprising:
    contacting with an etchant (i) the peripheral edge of the wafer, (ii) the edge portion of the front surface of the wafer, and (iii) the edge portion of the back surface of the wafer, thereby producing an edge-etched wafer; and
    reducing the total thickness variation of the edge-etched wafer to less than about 3 microns by lapping or grinding.

35. The method of claim 34 wherein R is at least about 150 mm.

36. The method of claim 34 wherein the peripheral edge and front and back edge portions of the wafer are contacted with the etchant by rotating the wafer.

37. The method of claim 34 wherein the peripheral edge and front and back edge portions of the wafer are contacted with the etchant for at least about 1 minute.

38. The method of claim 34 wherein the rotation of the wafer is reversed to cause the wafer to be rotated in both a clockwise and counter-clockwise rotation while the peripheral edge and front and back edge portions of the wafer are contacted with the etchant.

39. The method of claim 34 wherein the peripheral edge and front and back edge portions of the wafer are contacted with the etchant for a time such that at least about 10 μm, in terms of total thickness, is removed from the front and back edge portions of the wafer.

40. The method of claim 34 wherein the peripheral edge and front and back edge portions of the wafer are contacted with the etchant for a time such that the diameter of the wafer is reduced by at least about 10 μm.

41. The method of claim 34 wherein peripheral edges and edge portions of a plurality of wafers are concurrently contacted with the etchant.

42. The method of claim 34 further comprising contacting the front surface of the wafer with a caustic etchant to relieve stress in the wafer.

43. The method of claim 42 wherein the caustic etchant removes from about 0.5 μm to about 2 μm of material from the surface of the wafer.

44. The method of claim 34 comprising grinding the front surface and back surface of the edge-etched wafers to reduce the flatness of the wafer.

45. A method for removing silicon from a surface of a silicon wafer, the wafer comprising a central axis, a front surface and a back surface that are generally perpendicular to the central axis, a peripheral edge, a radius, R, extending from the central axis to a point along the peripheral edge of the wafer, and a nearest peripheral edge point along the peripheral edge of the wafer nearest the central axis, and edge portions of the front and back surfaces of the wafer that extend from the nearest peripheral edge point to a point between the nearest peripheral edge point and the central axis and no more than about 15 mm from the nearest peripheral edge point, the method comprising:

contacting with an etchant (i) the peripheral edge of the wafer, (ii) the edge portion of the front surface of the wafer, (iii) the edge portion of the back surface of the wafer, thereby producing an edge-etched wafer;

reducing the flatness of the edge-etched wafer by at least about 50%;

contacting the peripheral edge, front surface, and back surface of the edge-etched wafer with a caustic etchant in the form of an aqueous solution comprising a source of hydroxide ions;

polishing the front surface and back surface of the edge-etched wafer; and polishing the peripheral edge of the edge-etched wafer.

\* \* \* \* \*